(12) United States Patent
Sorace et al.

(10) Patent No.: US 12,366,874 B2
(45) Date of Patent: Jul. 22, 2025

(54) VOLTAGE REGULATION USING A DELTA-SIGMA MODULATOR, DEVICE AND METHOD

(71) Applicant: NXP B.V., Eindhoven (NL)

(72) Inventors: Christian Vincent Sorace, Falicon (FR); Ludovic Oddoart, Opio (FR); Fabien Boitard, Mouans Sartoux (FR); Nicolas Patrick Vantalon, Cannes (FR)

(73) Assignee: NXP B.V., Eindhoven (NL)

( * ) Notice: Subject to any disclaimer, the term of this patent is extended or adjusted under 35 U.S.C. 154(b) by 155 days.

(21) Appl. No.: 18/048,163

(22) Filed: Oct. 20, 2022

(65) Prior Publication Data

US 2023/0195151 A1  Jun. 22, 2023

(30) Foreign Application Priority Data

Dec. 17, 2021  (EP) .................................... 21306831

(51) Int. Cl.
| | | |
|---|---|---|
| *G05F 1/575* | (2006.01) | |
| *G05F 1/59* | (2006.01) | |
| *H03M 3/00* | (2006.01) | |

(52) U.S. Cl.
CPC ............... *G05F 1/575* (2013.01); *G05F 1/59* (2013.01); *H03M 3/428* (2013.01)

(58) Field of Classification Search
CPC ........... G05F 1/575; G05F 1/59; H03M 3/428
See application file for complete search history.

(56) References Cited

U.S. PATENT DOCUMENTS

| | | | |
|---|---|---|---|
| 7,253,595 B2 | 8/2007 | Oddoart et al. | |
| 8,643,436 B2 * | 2/2014 | Ni .......................... | H03F 3/217 |
| | | | 330/251 |
| 9,069,370 B2 | 6/2015 | Soenen et al. | |
| 9,766,678 B2 | 9/2017 | Muthukaruppan et al. | |
| 10,126,769 B2 | 11/2018 | Xu et al. | |

(Continued)

FOREIGN PATENT DOCUMENTS

| | | |
|---|---|---|
| EP | 2972640 B1 | 12/2019 |
| JP | 2013102638 A | 5/2013 |

OTHER PUBLICATIONS

Gharbiya, A., "Fully digital feedforward delta-sigma modulator", Research in Microelectronics and Electronics, 2005 PhD, Jul. 25, 2005, 4 pages.

*Primary Examiner* — Harry R Behm

(57) ABSTRACT

It is described a voltage regulator device (100), comprising:
i) a power device (150), configured to receive an input signal (151) and to produce a corresponding output signal (152);
ii) a comparator device (110), coupled via a feedback path (140) to the power device (150), and configured to receive the output signal (152) as a feedback signal (141), and to produce a compared feedback signal (112); and
iii) a digital modulation device (120), arranged between the comparator device (110) and the power device (150), and configured to digitally modulate the compared feedback signal (112), and to provide the digitally modulated signal (121) to the power device (150), wherein the digital modulation device (120) comprises:
iiia) a delta-sigma (122),
iiib) a quantizer (124), and
iiic) a feedforward path (128), configured to feedforward the compared feedback signal (112) beyond the delta-sigma (122).

18 Claims, 9 Drawing Sheets

(56) References Cited

U.S. PATENT DOCUMENTS

| | | | |
|---|---|---|---|
| 10,678,280 B2 | 6/2020 | Cho et al. | |
| 2006/0261789 A1 | 11/2006 | May | |
| 2012/0081176 A1* | 4/2012 | Buechner | G05F 1/56 |
| | | | 327/564 |
| 2013/0335049 A1* | 12/2013 | Schubert | H03K 7/08 |
| | | | 323/283 |
| 2014/0035769 A1* | 2/2014 | Rajaee | H03M 3/452 |
| | | | 341/143 |
| 2014/0117955 A1* | 5/2014 | Zoso | H02M 3/157 |
| | | | 323/271 |
| 2016/0202715 A1 | 7/2016 | Petrov | |
| 2020/0393861 A1 | 12/2020 | Shih et al. | |

* cited by examiner

US 12,366,874 B2

VOLTAGE REGULATION USING A DELTA-SIGMA MODULATOR, DEVICE AND METHOD

TECHNICAL FIELD

The present disclosure relates to a voltage regulation device that comprises a digital modulation device with a delta-sigma, a quantizer, and a feedforward path. Further, the present disclosure relates to a method of operating the voltage regulation device. Furthermore, the present disclosure related to a specific use of a pulse density modulation device. Thus, the present disclosure may refer to the technical field of voltage regulation.

TECHNICAL BACKGROUND

Voltage regulators such as LDO (low drop-out) voltage regulators are regulator circuits which are appropriate for many electronic applications, for example in automotive, mobile phone, or industrial applications. The voltage regulators are used to control/regulate a voltage of a power device/stage, thereby providing a well-defined and stable (DC) output voltage.

FIG. 13 shows an example of a conventional analog LDO. An input voltage $V_{IN}$ is provided to a power device that then produces a corresponding output voltage $V_{OUT}$. In order to regulate said output voltage, a feedback regulation path is established. The feedback signal (an analog signal) is provided to an error amplifier, wherein the error with respect to a reference voltage is amplified. Then, the analog error amplified signal is fed, via a buffer, back to the power device. Thereby, the output voltage is regulated.

FIG. 14 shows an example of a conventional digital LDO. Instead of the buffer in case of the analog LDO, the analog error amplified signal is converted by an analog-to-digital converter (ADC) to a digital signal.

FIG. 15 shows an alternative example of a conventional digital LDO, wherein an ADC and a shift register are applied instead of the error amplifier and ADC as in FIG. 14.

FIG. 16 shows a further alternative example of a conventional digital LDO, wherein an comparator and a so-called coarse class D device are applied instead of the error amplifier and ADC as in FIG. 14.

However, such conventional LDOs may suffer from different drawbacks. An analog regulator may for example have at least some of the following drawbacks: it needs a complex stability analysis because pole and zero location vary according the load current, requires area due to the power stage in the saturation region, is only suitable for applications requiring high PSRR or for low noise application, portability and scalability for small digital process are complex as conventional architectures are not necessarily convenient for low voltage application.

A digital regulator may for example have at least some of the following drawbacks: a high ripple, use of ADC and DAC, may require shift register and several comparators to control the power stage, and, due to the shift register, a poor bandwidth and ripple, no operation at a constant frequency.

A class D LDO may for example have at least some of the following drawbacks: uses a ramp, is process dependent, uses the power device in saturation region, and requires a filtering for the PWM signal to control the power stage.

In summary, it may be still seen as a challenge to operate a voltage regulator in an efficient and reliable manner.

OBJECT AND SUMMARY OF THE DISCLOSURE

There may be a need to operate a voltage regulator in an efficient and reliable manner. A voltage regulator device and a method of operating a voltage regulator device according to the independent claims are described in the following. Exemplary embodiments are described by the dependent claims.

According to an aspect of the present disclosure, there is described a voltage regulator device, comprising:
i) a power device, configured to receive an input signal (input voltage) and to produce a corresponding output signal (output voltage);
ii) a comparator device, coupled via a feedback path to the power device, and configured a) to receive the output signal as a feedback signal, and to b) produce a compared feedback signal (in other words: a comparator output); and
iii) a digital modulation device, arranged between the comparator device and the power device, and configured
a) to digitally modulate the compared feedback signal (the comparator output), and b) to provide the digitally modulated signal to the power device.

The digital modulation device (e.g. implemented as a delta-sigma modulator) comprises:
iiia) a delta-sigma,
iiib) a quantizer, and
iiic) a feedforward path, configured to feedforward the compared feedback signal beyond (around) the delta-sigma (e.g. to a coupling point between the delta-sigma and the quantizer or to the power stage/device, in other words, the feedforward path may feedforward quantified noise from the delta-sigma input beyond the delta-sigma output).

According to a further aspect of the present disclosure, there is described a method of operating a voltage regulator device, the method comprising:
i) receiving an input signal and producing a corresponding output signal by a power device;
ii) receiving the output signal as a feedback signal and producing a compared feedback signal by a comparator device;
iii) digitally modulating the compared feedback signal (the comparator output) by a digital modulation device that comprises a delta-sigma and a quantizer (arranged downstream of the delta-sigma) to obtain a digitally modulated signal; and
iv) providing the digitally modulated signal to the power device.

The method further comprises:
v) feeding forward the compared feedback signal via a feedforward path beyond the delta-sigma.

According to a further aspect of the present disclosure, there is described a use (method of using) of a pulse density modulation (PDM) device, which comprises a feedforward path around a delta-sigma, in between a comparator device and a power device of a low dropout voltage regulator.

In the context of this document, a "power device" can in particular comprise a plurality of power units, e.g. a (digital-to-analog) converter and/or a power switch (preferably connected in parallel). In an example, the power device comprises a plurality of power switches in linear region. A power device can be a power stage or a part of a power stage. In an example, a power stage comprises the power device (in particular with a plurality of power units) and one or more driver device(s) or one or more driver and level shifter device(s).

In the context of this document, a "comparator device" may be a device that is configured to compare two signals, e.g. a feedback signal and a reference signal. A comparator may be an error amplifier and may be implemented, for example, as a differential amplifier. In this context, the comparator output can be termed "compared feedback signal".

In the context of this document, a "digital modulation device" may be a device configured to perform a digital modulation of an (analog) input signal (e.g. a comparator output) to yield a digitally modulated output signal (e.g. to a power device). The described digital modulation device can be implemented as a delta-sigma modulator. In an embodiment, the digital modulation device is realized as a pulse density modulation (PDM) device.

In the context of this document, a "delta-sigma modulator" may be a device that comprises a delta-sigma (unit) (i.e. a difference and an integrator) and a quantizer (unit). The quantizer may be, e.g., a single-bit quantizer or a multi-bit quantizer. A delta-sigma modulation may convert an analog voltage signal into a pulse width, or pulse density, which can be understood as pulse-density modulation (PDM).

Further, the delta-sigma modulator can comprise a feedforward path, e.g. from the input to the quantizer of the delta-sigma modulator. The input to the loop filter of the delta-sigma may no longer contain the signal, rather only the filtered quantization noise. Hence, the loop filter/delta-sigma does not process the signal but only the (shaped) quantized noise. The linearity may thus not need not to be high, and the feedforward path may enhance stability and improve the dynamic range. The advantage of the feedforward path may be that the loop filter/delta-sigma processes only the quantized noise, by reducing the constraint on the loop filter in terms of dynamic range.

According to an exemplary embodiment, the present disclosure may be based on the idea that a voltage regulator can operate in an efficient and reliable manner, when the feedback signal from the power device is guided to a comparator device and, via a digital modulation device, back to the power device, wherein the digital modulation device is implemented as a delta-sigma modulator with a delta-sigma, a quantizer, and a feedforward path which feeds forward the comparator output around the delta-sigma. The digital modulation device (in particular a PDM controller) controls the regulation loop, meaning that the delta-sigma and the (multi-bit) quantizer control the output power devices. Due to the delta-sigma, the data stream (quantizer) output may be at a fixed sampling rate.

It has been found surprisingly by the inventors that especially the novel feedforward path around the delta sigma may reduce the quantizer noise and thereby improve the output ripple and the device stability. Further, an operation at a constant frequency may be enabled in this manner.

By these measures, the design is significantly simplified, while the stability analysis complexity is reduced. The described design is a digital one (the control part is fully digital and can be synthetized), so that drawbacks of analog systems are overcome in the first place (operation at lower voltages is enabled compared to analog regulators, since analog design is reduced to a comparator). The described device may allow to drive high load current (e.g. 200 mA) with a simplified stability compared to an analog regulator.

The described voltage regulator may be applied for example to supply circuits such as CPUs, digital functionalities (in particular NFC and secure element products), or memories, as there is no specific constraint in terms of noise or power supply rejected ratio. Scalability and portability for digital technology (e.g. a node like 16 nm, 28 nm, or 40 nm) can be further improved, which may be important, since digital technology can be demanding regarding maximum power consumption (e.g. 150 mA for an 40 nm product and 230 mA for a 28 nm product).

DESCRIPTION OF EXEMPLARY EMBODIMENTS

In the following, further exemplary embodiments of the device and the method will be explained.

In an embodiment of the present disclosure, the digital modulation device comprises a pulse density modulation (PDM) device. PDM is a form of modulation used to represent an analog signal with a binary signal, wherein the relative density of the pulses essentially corresponds to the amplitude of the analog signal. Hereby, pulse-width modulation (PWM) may be a special case of PDM, wherein the switching frequency is fixed and all the pulses corresponding to one sample are contiguous in the digital signal. The described device may operate using the PDM device/controller to control the regulation loop. The PDM modulation is achieved through the delta-sigma modulator, the quantizer and the feedforward path. By using the delta-sigma modulator and the quantizer, the output power devices are controlled.

In a further embodiment of the present disclosure, the quantizer is a multi-bit quantizer (see e.g. FIG. 9 below). The multi-bit quantizer may allow to control a plurality of power units in a power device/stage at the same time. Thereby, the output voltage ripple may be reduced. In an example, the data stream (quantizer output) goes through a number of selected power units (and an output capacitor). Hereby, the number of active power units depends on the data stream of the multi-bit quantizer. The power device may operate here as a DAC.

In an example, the output voltage ripple may be adjusted through at least one of the following parameters: the number of bits of the multi-bit quantizer, the number of power units in parallel, the switching frequency, the output capacitor properties, the quantization step size, the number of levels of the quantizer.

In a further embodiment of the present disclosure, the digital modulation device further comprises a digital modulation feedback path, configured to feed back the output of the quantizer to the input of the delta-sigma modulator. Thereby, an efficient regulation may be enabled. In an example, the computation is achieved digitally. In an example, the respective values of the bits are taken, the bits <N:1> are included, and a computation with a sum is made. Then, it is amplified through gain Gb and returned to the minus input of the delta domain. The digital modulation feedback path can comprise a digital-to-analog converter (DAC) and/or a DAC functionality that is implemented in the computation.

In a further embodiment of the present disclosure, the feedforward path is configured to feedforward the compared feedback signal (comparator output) to a coupling point (sum formation) between the delta-sigma and the quantizer. Thereby, only the quantized (filtered, shaped) noise is processed in the loop filter (delta-sigma), thereby improving linearity and dynamic range requirements and stability. The gain of the feedforward path is then added to quantify only the noise in the delta-sigma. Using the feedforward path, one may get only the quantization noise in the delta-sigma.

In a further embodiment of the present disclosure, the voltage regulator device further comprises a driver device, in particular a driver device and a level shifter device, arranged between the digital modulation device and the power device (and form part of the power stage) and/or between the comparator device and the digital modulation device.

In a further embodiment of the present disclosure, the feedforward path is configured to feedforward the compared feedback signal to the driver and/or level shifter device.

In a further embodiment of the present disclosure, the comparator device (and the power device (and the driver device, in particular the driver device and the level shifter device)) is/are part of an analog domain, and the digital modulation device is part of a digital domain. A driver device can be used to set the strength of the signal to control the power device. A level shifter device may allow to move from a supply voltage (e.g. high/low) to another one.

In a further embodiment of the present disclosure, the voltage regulator device is configured as a low dropout (LDO) voltage regulator device.

In a further embodiment of the present disclosure, the comparator device is configured to compare the feedback signal with a reference voltage to produce the compared feedback signal. In an example, the comparator may be implemented in continuous time with a hysteresis.

In a further embodiment of the present disclosure, the voltage regulator device further comprises a clock device, configured to provide a clock signal to the digital modulation device. In an example, a fast clock (e.g. 20 MHz) may be applied.

In a further embodiment of the present disclosure, the clock device is further configured to provide a further clock signal to the comparator device. In this manner, the comparator can be implemented as a latch comparator.

In a further embodiment of the present disclosure, the power device comprises a plurality of power units such as a power switches. The power units can be arranged in linear region (configured as power switches), thereby potentially saving space. The power device can be designed with several power units in parallel. In an example, in terms of functionality, the plurality of power switches operates as a digital-to analog converter.

BRIEF DESCRIPTION OF THE DRAWINGS

The illustrations in the drawings are schematic. In different drawings, similar or identical elements are provided with the same reference signs.

DETAILED DESCRIPTION OF THE DRAWINGS

Figure 1:
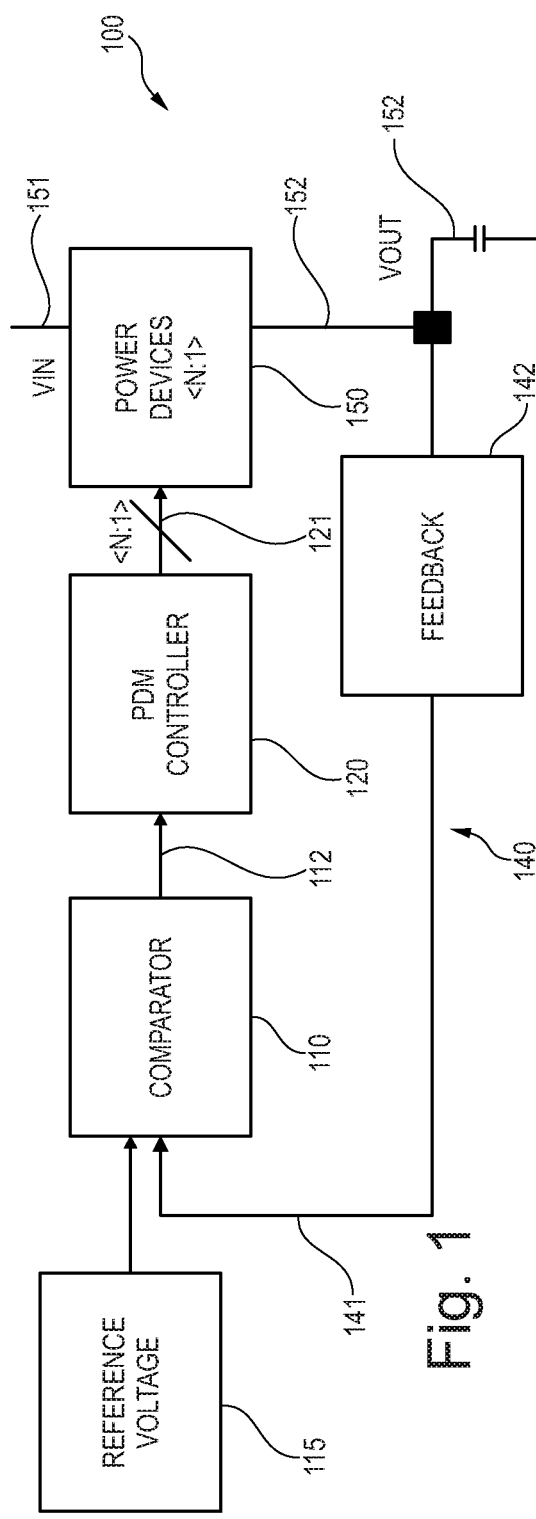
FIG. 1 illustrates a voltage regulation device according to an exemplary embodiment of the present disclosure.

Before referring to the drawings, exemplary embodiments will be described in further detail, some basic considerations will be summarized based on which exemplary embodiments of the present disclosure have been developed.

According to exemplary embodiments of the present disclosure, there is described a novel control method for an LDO that combines a comparator with a PDM controller and a power stage. The PDM controller is achieved through a digital delta-sigma modulator with a multi-bit quantizer and a feedforward path. This approach reduces complexity in terms of design and stability analysis, saves chip area (as power devices operate only in linear region), improves scalability and portability for digital technology node.

According to exemplary embodiments of the present disclosure, the control method can comprise the following features:
  i) decrease design and stability analysis complexity.
  ii) improve scalability and portability for digital technology node.
  iii) PDM controller is achieved through a delta-sigma and a multibit quantizer.
  iv) use a feedforward path in the delta-sigma modulation to reduce the quantization noise and consequently the ripple and also to improve stability.
  v) save area by using the power stage devices in linear region (as switches) and not in saturation as for analog or class D LDO.
  vi) do not have stability issue like internal pole and zero variations due to large current load variation.
  vii) has a reduced number of poles and zeros compared to an analog solution.
  viii) does not require error amplifier with stability, buffer, pole tracking or power device in saturation.
  ix) can operate at lower voltage compared to analog regulator, as only a comparator and power switches are required in the analog part.
  x) the control part is fully digital and can be synthetized.

FIG. 1 illustrates a voltage regulation device 100 according to an exemplary embodiment of the present disclosure. The device 100 comprises a power device 150, wherein the power device 150 is configured to receive an input signal 151 (voltage $V_{IN}$) and to produce a corresponding output signal 152 (voltage $V_{OUT}$). A feedback path 140 is coupled to the power device 150 in order to regulate the output signal 152. The feedback path 140 guides the output signal 152 as a feedback signal 141 back to a comparator device 110, e.g. an error amplifier. The feedback path 140 can comprise a resistor ladder 142. The comparator 110 compares the (analog) feedback signal 141 to a reference voltage 115 and produces a corresponding compared feedback signal 112 as an output. The comparator output 112 will define, if the output voltage 152 is higher or lower than the target voltage. Said compared feedback signal 112 is then further provided to a digital modulation device 120 that is arranged between the comparator device 110 and the power device 150, thereby closing the feedback/regulation loop. The digital modulation device 120 is implemented as a pulse density modulation (PDM) device and configured to digitally modulate the compared feedback signal 112 and to provide the digitally modulated signal 121 back to the power device 150.

Figure 2:
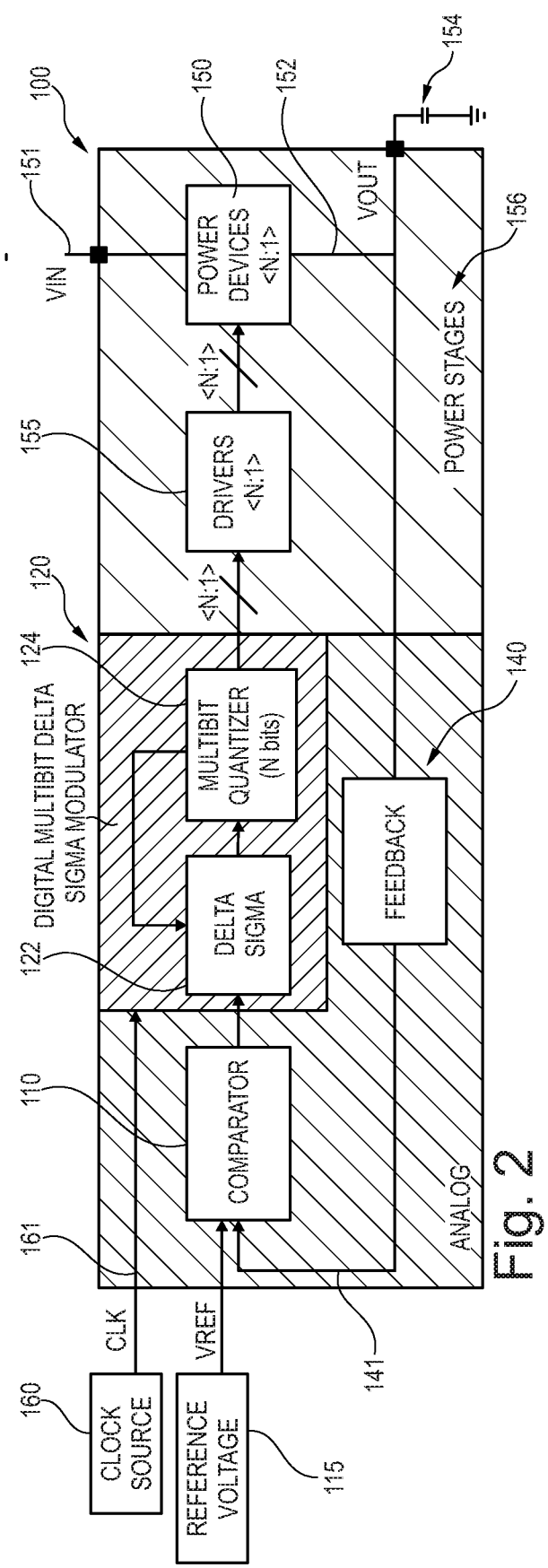
FIG. 2 illustrates a voltage regulation device according to a further exemplary embodiment of the present disclosure.

FIG. 2 illustrates a voltage regulation device 100 according to an exemplary embodiment of the present disclosure. The device 100 is very similar to the one shown in FIG. 1 but shows more details. It can be seen that the PDM device 120 is implemented as a delta-sigma modulator that comprises a delta-sigma 122 and a multi-bit quantizer 124. A clock device 160 provides a clock signal 161 to the PDM device 120 for the digital modulation. Between the PDM device 120 and the power device 150, there is coupled a driver (and optionally a level shifter) device 155. The power device 150 (which can comprise a plurality of power units) and the driver/level shifter device 155 form a power stage 156. Further, it is illustrated that the comparator device 110, the feedback path 140 (in principle also the power device 150) and the driver/level-shifter devices 155 form an analog (signal) domain, while the PDM 120 forms a digital (signal) domain. The output 152 further comprises an output capacitor 154 that can be internal or external to the device 100.

Figure 3:
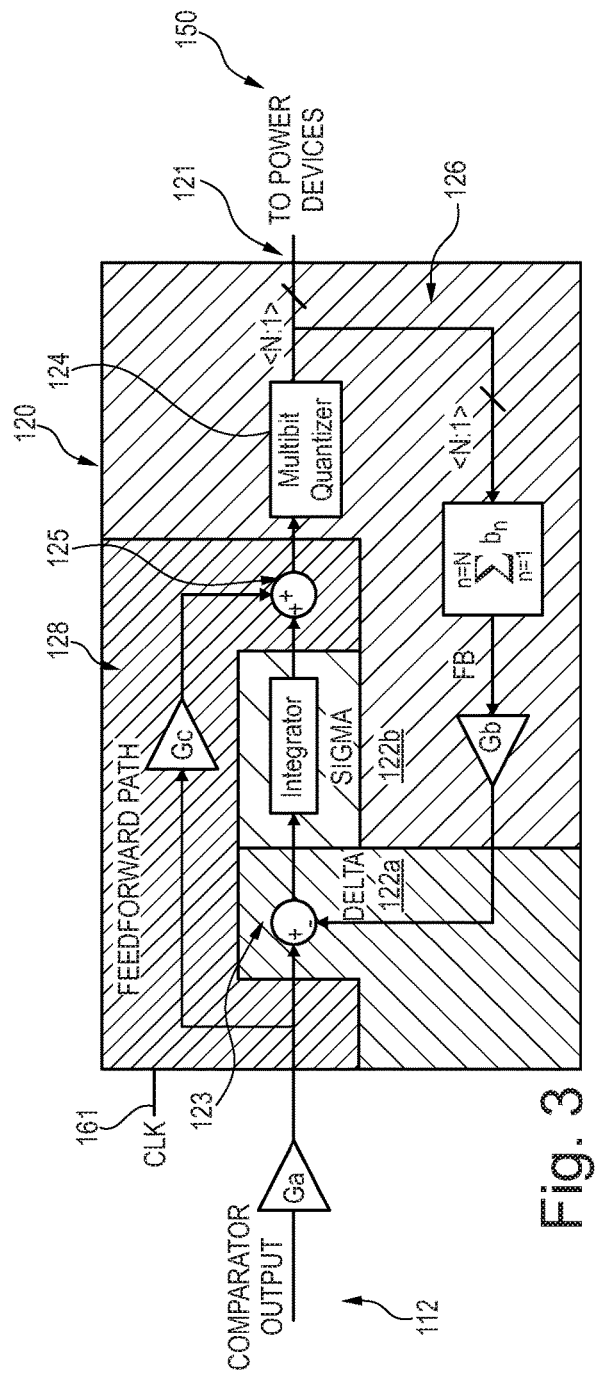
FIG. 3 illustrates a digital modulation device according to a further exemplary embodiment of the present disclosure.

FIG. 3 illustrates the digital modulation device 120 according to an exemplary embodiment of the present disclosure in detail. The (analog) compared feedback signal 112 from the comparator device 110 is the input, while the digitally modulated signal 121 (data stream) is the output to the power device 150. The delta-sigma 122 comprises a delta domain 122*a* (difference) and a sigma domain 122*b* (integrator). There is established a feedforward path 128, configured to feedforward the compared feedback signal 112 beyond (around) the delta-sigma 122. In particular, in this example, the feedforward path 128 feeds forward the compared feedback signal 112 to the coupling point 125 (sum) between delta-sigma 122 and quantizer 124. The feedforward path 128 can comprise a gain Gc.

Further, the digital modulation device 120 comprises a feedback path 126 that is established between the output of the quantizer 124 and the coupling point 123 (difference) of the delta domain 122*a*, the sigma domain 122*b*, and the comparator output 121. The feedback path 126 can further comprise a gain Gb, which is the gain of the delta sigma feedback loop. The feedback path 126 is a digital path, and computes the digital quantizer output 121 to a digital value used as negative input of the delta sigma. It can be considered by analogy, that the feedback path functionality is similar to digital-analog converter (DAC) functionality.

The signal feedback FB corresponds in this example to the sum of the binary bits on the data stream bus <N:1>, in other words, it follows the following equation: FB=$\Sigma_{n=1}^{n=N}$bn. For example, in the case of a 8-bit bus (N=8) and there would be the following bit correspondence: {b8, b7, b6, b5, b4, b3, b2, b1}=0000 1111, or FB=$\Sigma_{n=1}^{n=8}$bn=1+1+1+1+0+0+0+0=4.

Figure 4:
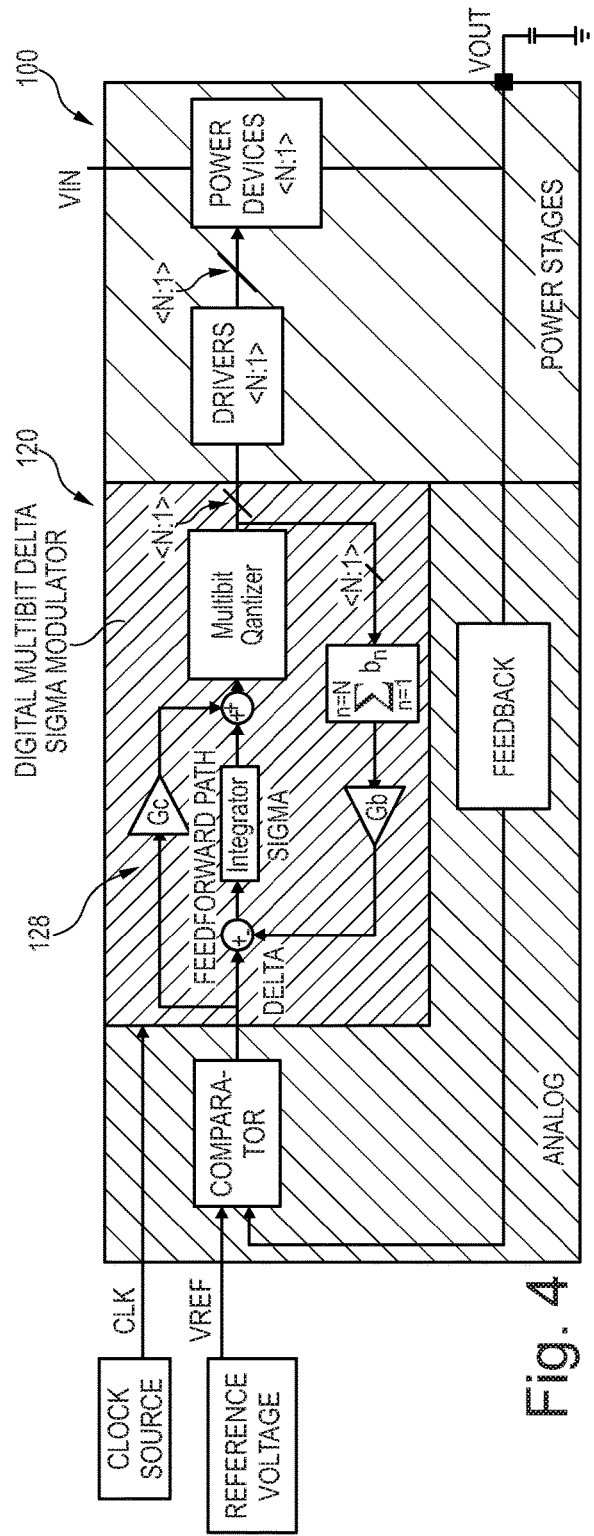
FIGS. 4 to 7 illustrate respectively a voltage regulation device according to further exemplary embodiments of the present disclosure.

FIG. 4 illustrates a voltage regulation device 100 according to a further exemplary embodiment of the present disclosure. FIG. 4 shows in principle the detail view of the digital modulation device 120 of FIG. 3 in the device of FIG. 2.

Figure 5:
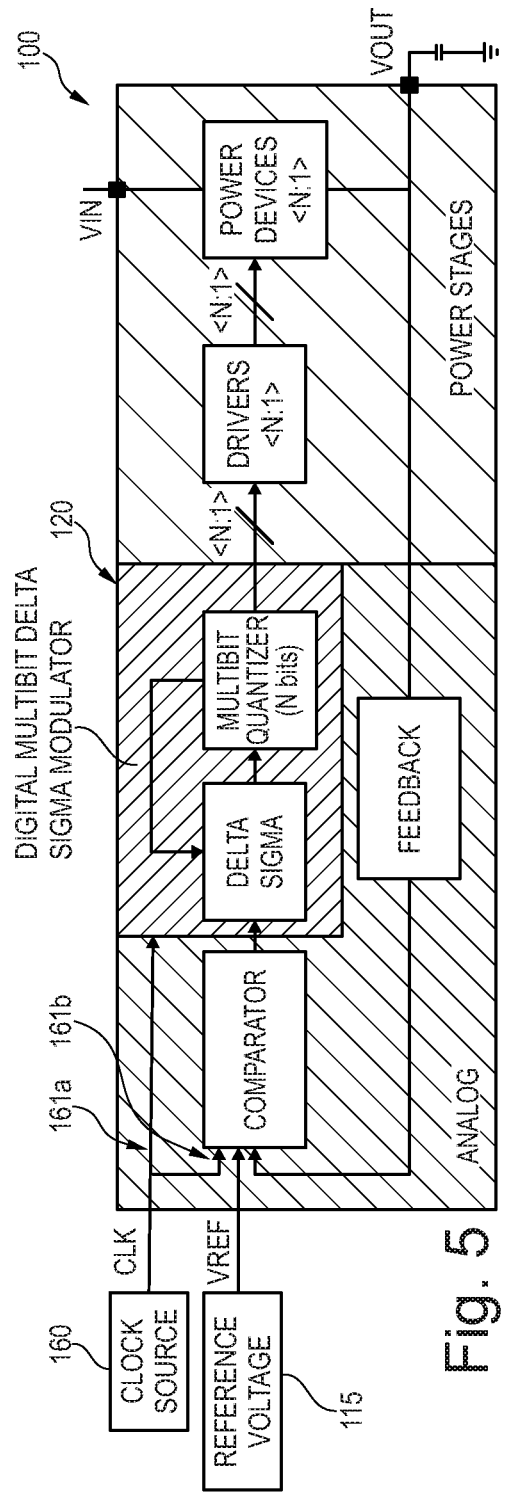

FIG. 5 illustrates a voltage regulation device 100 according to a further exemplary embodiment of the present disclosure. In this example, the clock device 160 is further connected to the comparator device 110 and provides the clock signal 161 thereto. In this manner, the comparator device 110 can be operated as a latch comparator.

Figure 6:
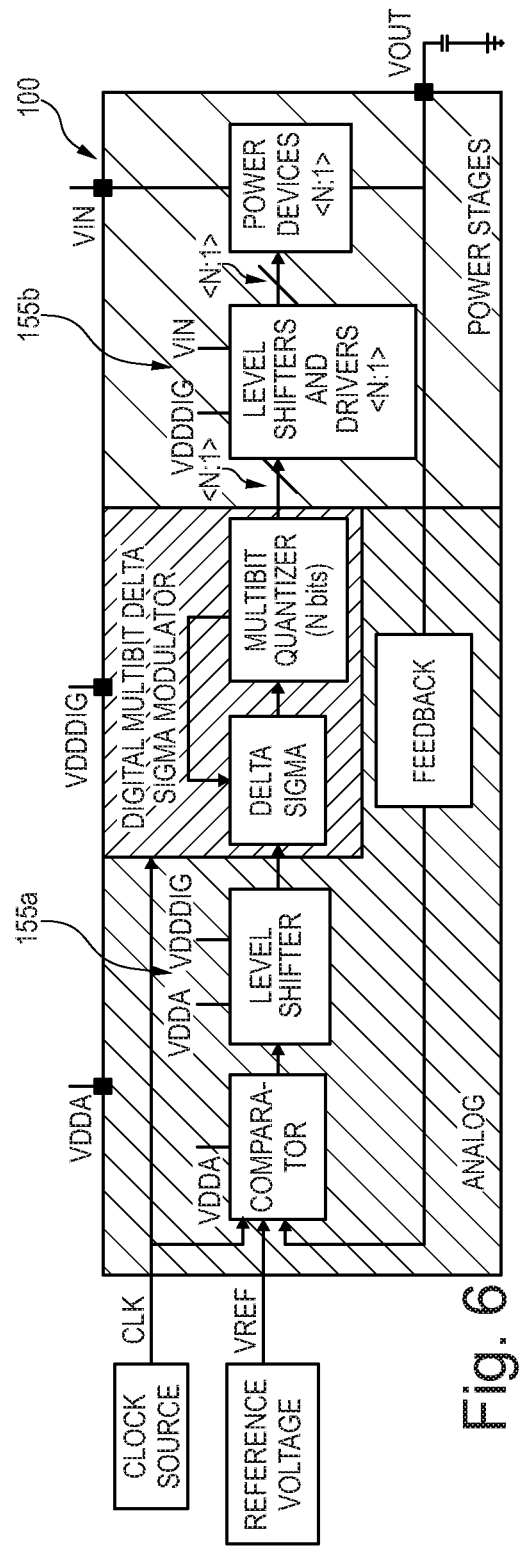

FIG. 6 illustrates a voltage regulation device 100 according to a further exemplary embodiment of the present disclosure. In this example, which is based on the example of FIG. 5, there is a first level shifter device 155*a* coupled between the comparator device 110 and the digital modulation device 120, while a second driver and level shifter device 155*b* is coupled between the digital modulation device 120 and the power device 150. Thereby, potentially different power domains may be established in the device 100.

Figure 7:
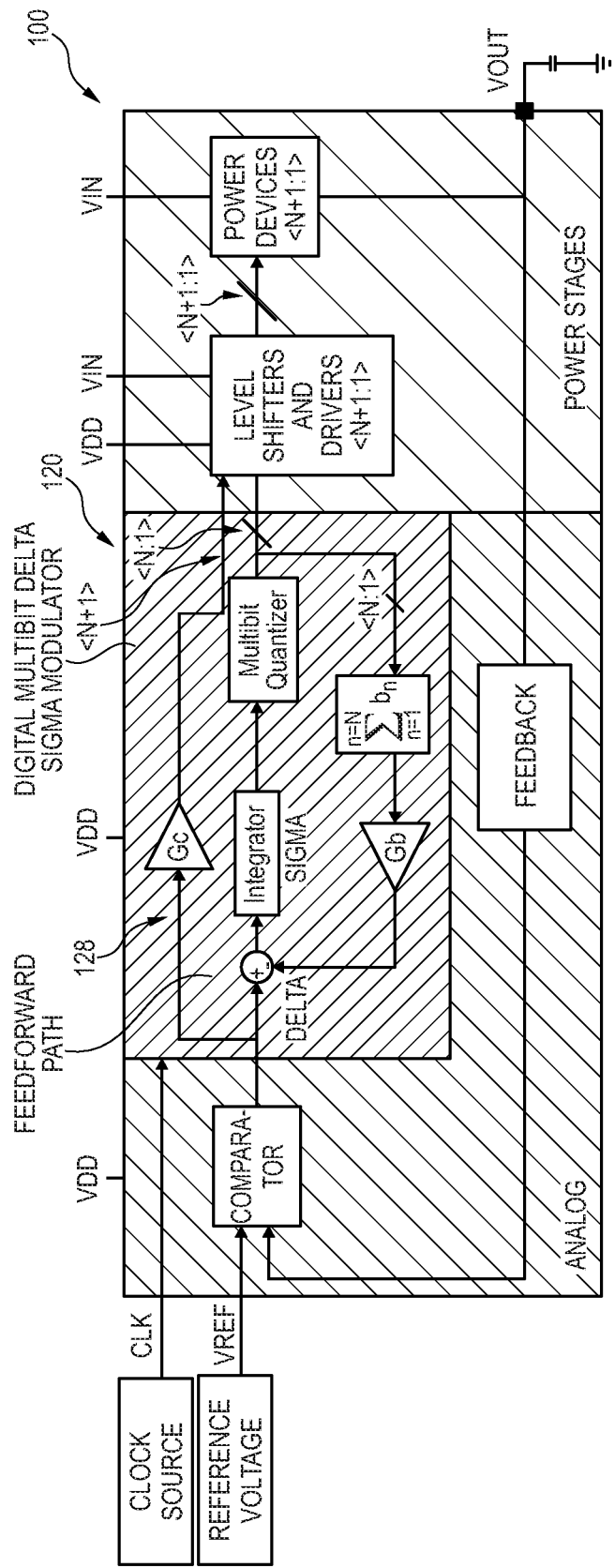

FIG. 7 illustrates a voltage regulation device 100 according to a further exemplary embodiment of the present disclosure. In this example, which is based on the example shown in FIG. 4, the feedforward path 128 is configured to feedforward the compared feedback signal 112 to the (second) driver and level shifter device 155*b*. In this case, the forward path 128 goes outside the modulator 120 to control directly the power stage 156 (and/or power device 150).

Figure 8:
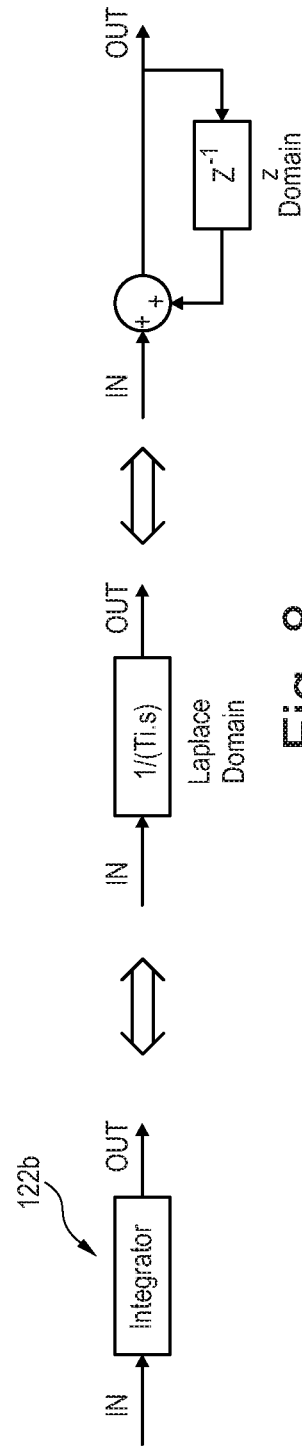
FIG. 8 illustrates alternative representations of the integrator for transfer function computation in Laplace domain or in Z-domain.

FIG. 8 illustrates alternative representations of the integrator 122*b* for transfer function computation in Laplace domain or in Z-domain. While in the example on the left side an integrator 122*b* is applied (see also the previous Figures), the example in the middle applies a Laplace transform/domain for continuous time modelisation. Further, the example on the right side applies a Z-transform/domain for discrete time modelisation.

Figure 9:
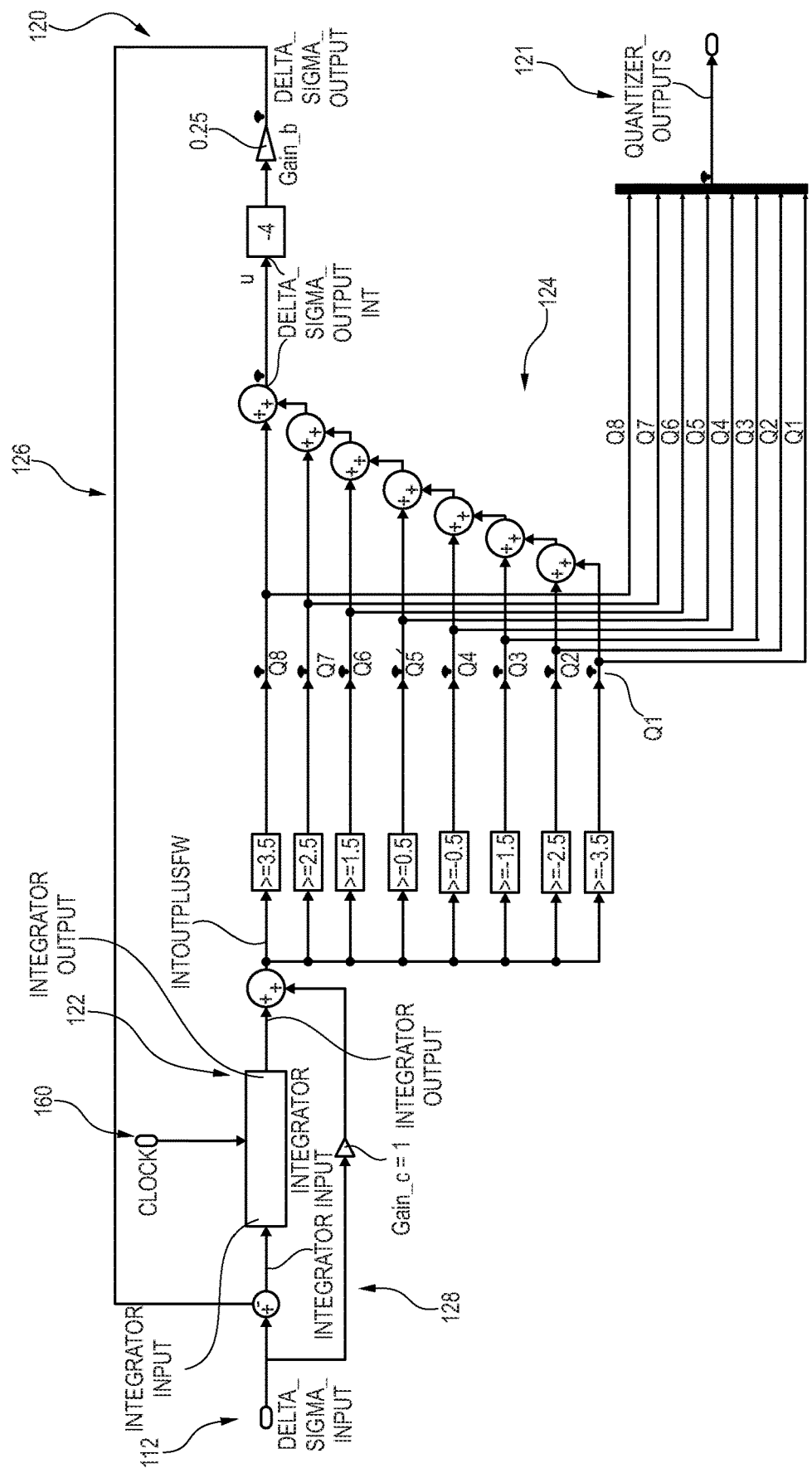
FIG. 9 illustrates in detail the multi-bit quantizer according to an exemplary embodiment of the present disclosure.

FIG. 9 illustrates in detail the multi-bit quantizer 124 according to an exemplary embodiment of the present disclosure. The digital modulation device 120 is configured as described above, but, in this detailed Figure, it can be seen that the multi-bit quantizer 124 applies a plurality of stages in order to provide the quantizer output(s) 121.

Figure 10:
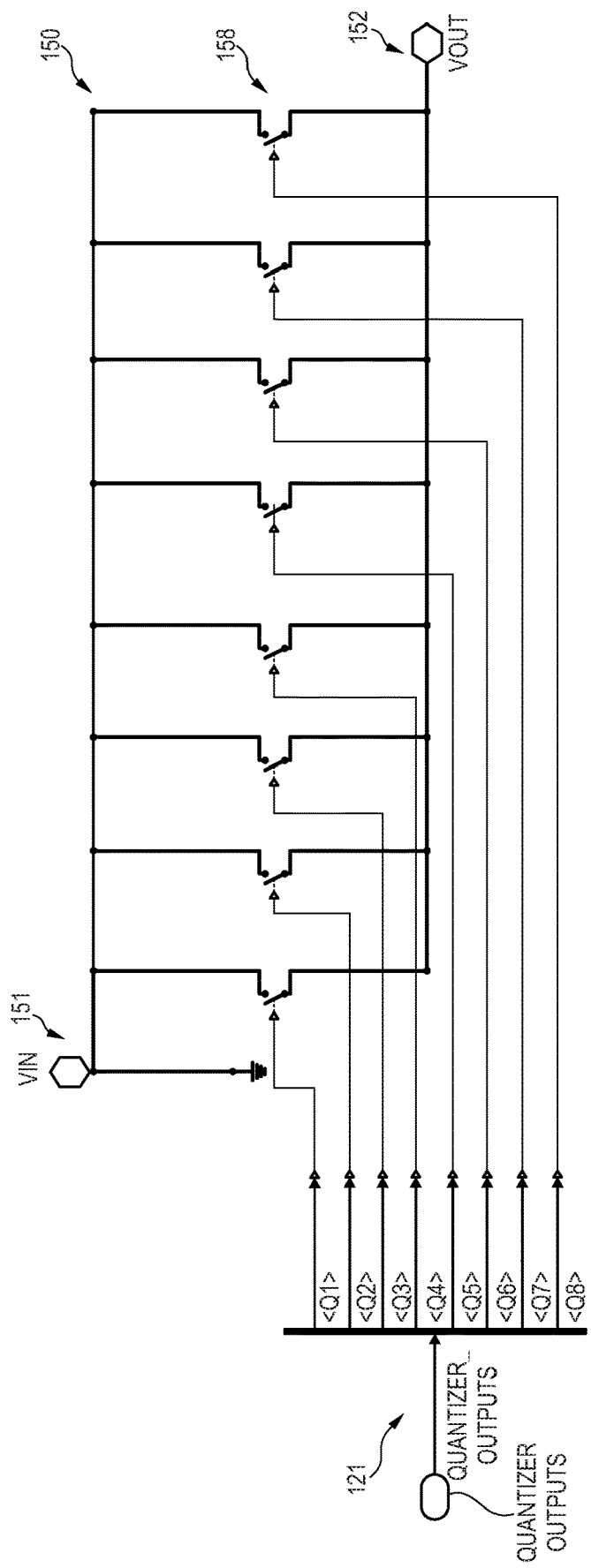
FIG. 10 illustrates in detail the power device according to an exemplary embodiment of the present disclosure.

FIG. 10 illustrates in detail the power device 150 according to an exemplary embodiment of the present disclosure. In this detailed example, the power device 150 comprises a plurality of power units 158 that are configured as power switches connected in parallel. In this example, each quantizer output 121 is connected to a specific power switch 158.

Figure 11:
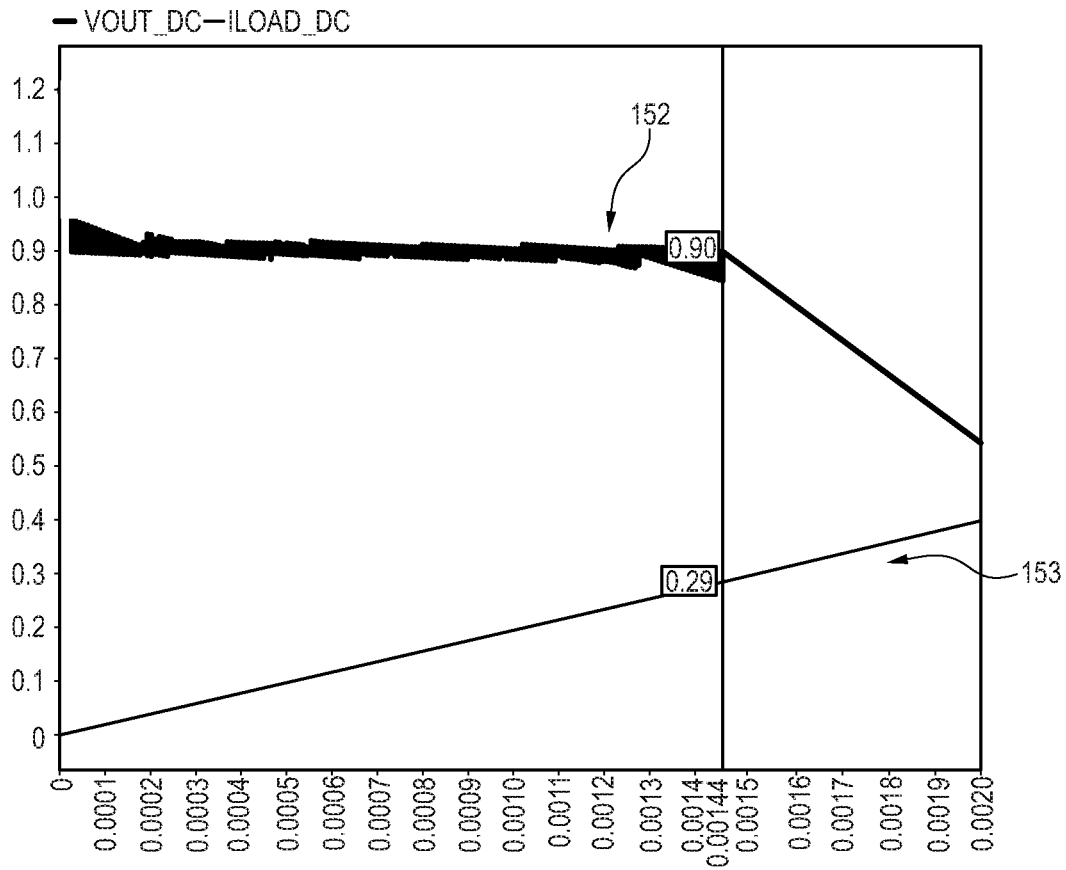
FIG. 11 illustrates in a diagram a simulation of the output signal in comparison to a load current according to an exemplary embodiment of the present disclosure.

FIG. 11 illustrates in a diagram a simulation of the output signal 152 in comparison to a DC load current 153 provided to the power device 150 according to an exemplary embodiment of the present disclosure. Even though the DC load current 153 increases significantly in a linear manner, the voltage output 152 is regulated in an efficient and reliable manner by the described voltage regulator device 100.

Figure 12:
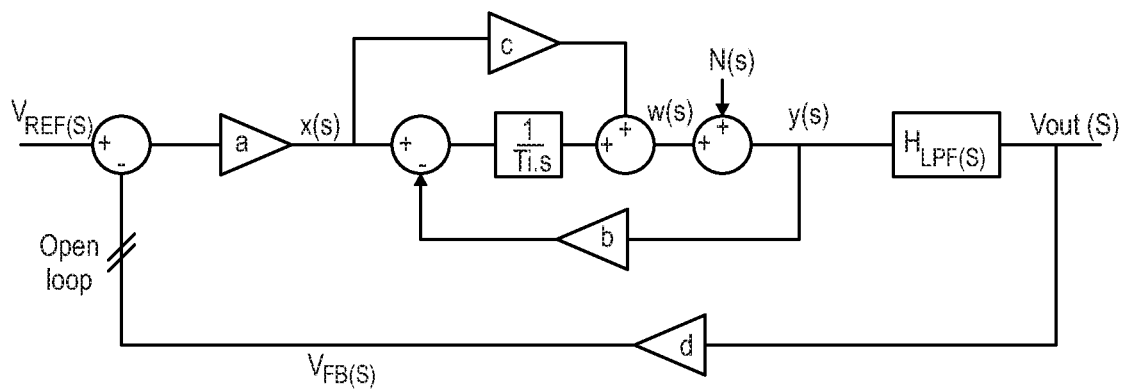
FIG. 12 illustrates a digital modulation device, used to perform calculations regarding the transfer function, according to an exemplary embodiment of the present disclosure.
Figure 13:
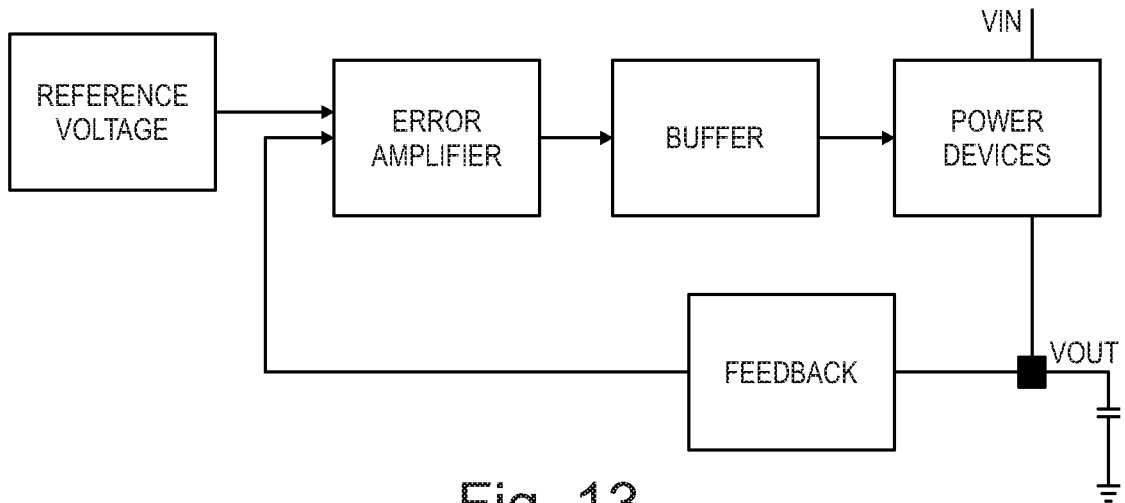
FIGS. 13 to 16 illustrate conventional LDOs (see description above).
Figure 14:
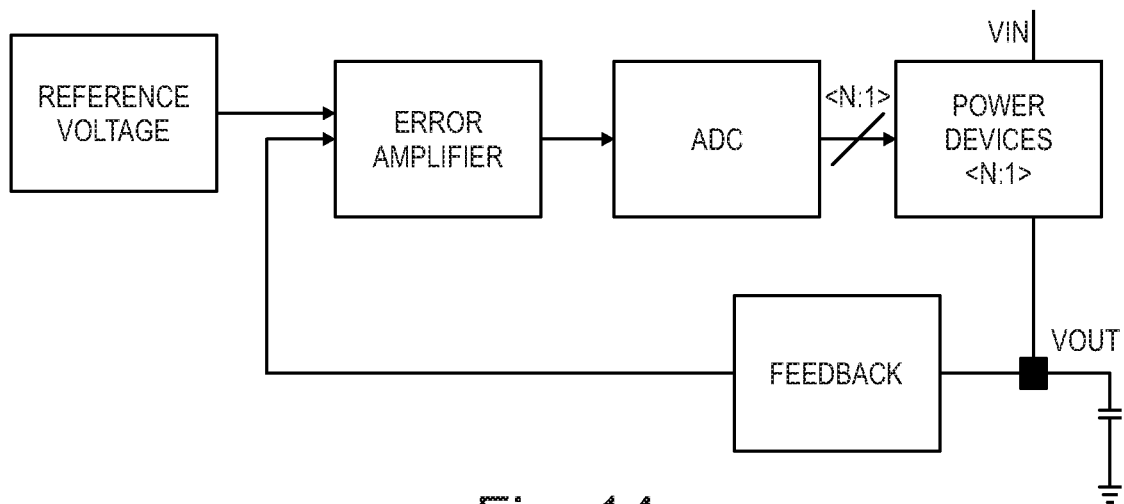
Figure 15:
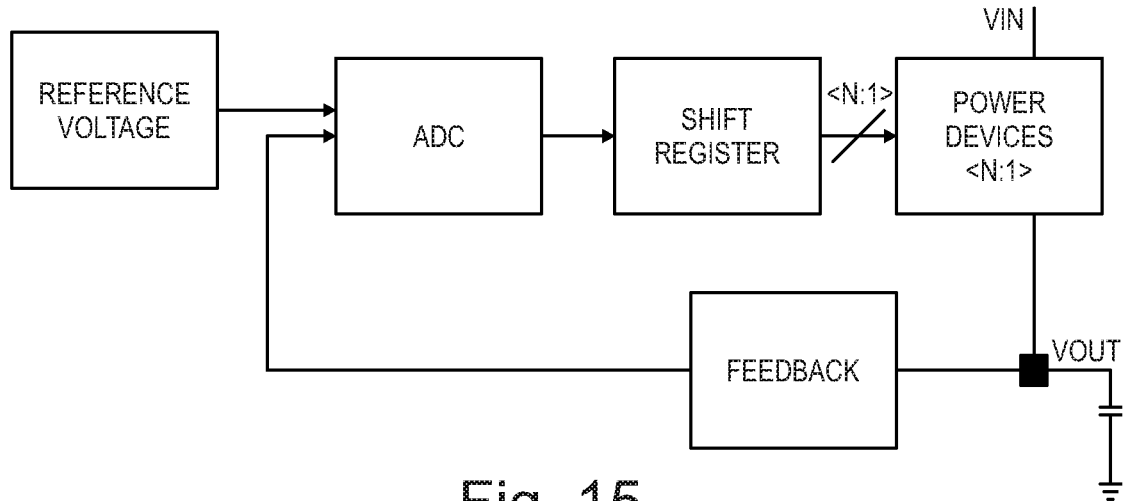
Figure 16:
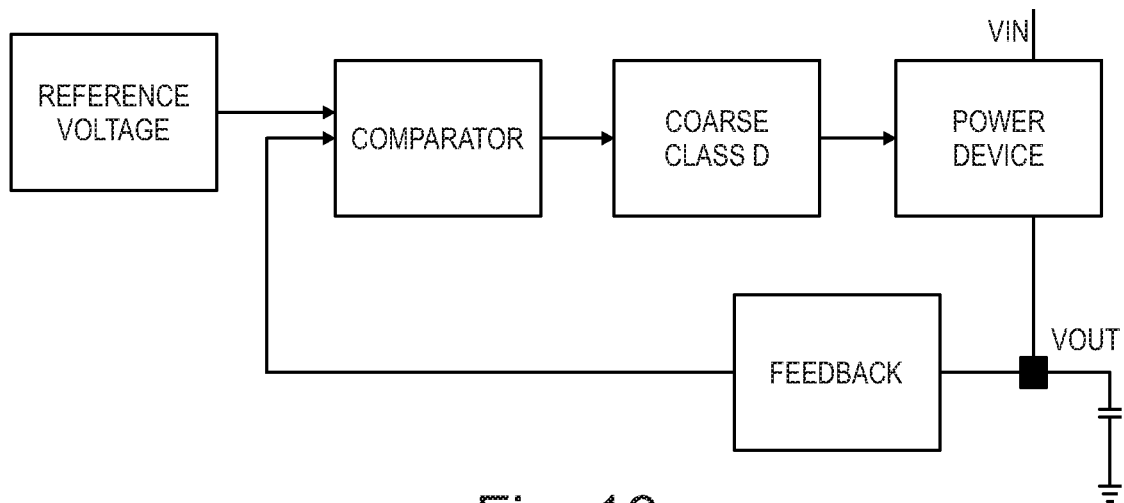

FIG. 12 illustrates a digital modulation device 120, here a delta-sigma modulator, according to an exemplary embodiment of the present disclosure. This Figure is used as a base for the following calculations regarding the transfer function. Hereby, Ti is the period of the clock (comparable to the sampling period of the integrator). An assumption is that the power stage is considered as having a transfer function like a low pass filter.

For the following computation, we consider
a is the comparator gain
b is the delta sigma modulator feedback gain
c is the feedforward path gain
d is the regulator feedback gain
$V_{out}(s)$ is the output of the regulator
Ti is the period of the clock
$V_{FB}(s)$ is the regulator feedback
$V_{REF}(s)$ is the reference of the regulator
Transfer Function Calculation $$x(s)=a \cdot V_{REF}(s)$$

$$w(s)=c \cdot x(s)+[x(s)-b \cdot y(s)] \cdot [1/(Ti \cdot s)]$$

$$y(s)=w(s)+N(s)$$

$V_{out}(s) = H_{LPF}(S) \cdot y(s)$ $V_{FB}(s) = d \cdot Vout(s)$ $y(s) = [(c \cdot Ti \cdot s + 1)/(Ti \cdot s + b)] \cdot x(s) + [(Ti \cdot s)/(Ti \cdot s + b)] \cdot N(s)$, with $x(s) = a \cdot V_{REF}(s)$ the transfer function is $y(s) = a \cdot [(c \cdot Ti \cdot s + 1)/(Ti \cdot s + b)] \cdot V_{REF}(s) + [(Ti \cdot s/b)/(Ti \cdot s/b + 1)] \cdot N(s)$ 1) if N(s)=0, the open loop signal transfer function is $y(s) = a[(c \cdot Ti \cdot s + 1)/(Ti \cdot s + b)] \cdot V_{REF}(s)$ The open loop signal transfer function is $(V_{FB}(s)/V_{REF}(s)) = (a \cdot d \cdot c/T_{LPF}) \cdot [s + 1/(c \cdot Ti)]/[(s + b/Ti) \cdot (s + 1/T_{LPF})]$ From this transfer function, poles and zeros can be described as follows:

$P_{LPF} = -1/T_{LPF}$ (power stage pole assumed acting as a low pass filter)

$pi = -b/Ti$ (integrator pole)

$zi = -1/(c \cdot Ti)$ (integrator zero)

$Gain_{DC} = a \cdot d \cdot c/T_{LPF}$ (DC Gain of the regulator)

By having b=1/c in a computation, the pole and zero of the integrator (of the delta-sigma) cancel each other, thereby simplifying stability as the stability response is similar to a first order stability system. It follows in particular, that by providing the feedforward path (see c) and the feedback path (see b), the stability of the described voltage regulator device can be improved.

2) if $V_{REF}(s) = 0$, the open loop noise transfer function is $y(s) = [(Ti \cdot s/b)/(Ti \cdot s/b + 1)] \cdot N(s)$ The open loop noise transfer function is $(V_{FB}(s)/N(s)) = (d/T_{LPF}) \cdot [(s/(s + (b/Ti)))] \cdot [(1/(s + (1/T_{LPF})))]$, wherein [s/(s+(b/Ti))] represents a high pass filter.

REFERENCE NUMERALS

100 Voltage regulation device
110 Comparator device
112 Compared feedback signal, comparator output
115 Reference signal/voltage
120 Digital modulation device
121 Quantizer output, data stream
122 Delta-sigma
122a Delta domain
122b Sigma domain, integrator
123 First coupling point (difference)
124 Quantizer
125 Second coupling point (sum)
126 Digital modulation feedback path
128 Feedforward path
140 Feedback path
141 Feedback signal
142 Resistor ladder or unity gain feedback path
150 Power device
151 Input signal/voltage
152 Output signal/voltage
153 DC load current
154 Output capacitor
155 Driver device
155a Level-shifter device
155b Driver and level-shifter device
156 Power stage
158 Power unit, power switch
160 Clock device
161, 161a,b Clock signal

What is claimed is:

1. A voltage regulator device, comprising:
   a power device, configured to receive an input signal and to produce a corresponding output signal;
   a comparator device, coupled via a feedback path to the power device, and configured to
      receive the output signal as a feedback signal, and
      produce a compared feedback signal;
   a digital modulation device, arranged between the comparator device and the power device, and configured to digitally modulate the compared feedback signal, and provide a digitally modulated signal to the power device,
   wherein the digital modulation device comprises:
      a delta-sigma,
      a quantizer, and
      a feedforward path, configured to feedforward the compared feedback signal beyond the delta-sigma; and
   a driver device arranged between the digital modulation device and the power device, wherein the feedforward path is configured to feedforward the compared feedback signal to the driver device.

2. The voltage regulator device according to claim 1, wherein the digital modulation device comprises a pulse density modulation, PDM, device.

3. The voltage regulator device according to claim 1, wherein the quantizer is a multi-bit quantizer.

4. The voltage regulator device according to claim 1, wherein the digital modulation device further comprises:
   a digital modulation feedback path, configured to feedback the output of the quantizer to the delta-sigma.

5. The voltage regulator device according to claim 1, wherein the feedforward path is configured to feedforward the compared feedback signal to a coupling between the delta-sigma and the quantizer.

6. The voltage regulator device according to claim 1, further comprising:
   a level shifter arranged between the comparator device and the digital modulation device.

7. The voltage regulator device according to claim 1, wherein the comparator device is part of an analog domain, and
   wherein the digital modulation device is part of a digital domain.

8. The voltage regulator device according to claim 1, wherein the voltage regulator device is configured as a low dropout, LDO, device.

9. The voltage regulator device according to claim 1, wherein the comparator device is configured to compare the feedback signal with a reference voltage to produce the compared feedback signal.

10. The voltage regulator device according to claim 1, further comprising:
    a clock device, configured to provide a clock signal to the digital modulation device.

11. The voltage regulator device according to claim 10, wherein the clock device is further configured to provide a further clock signal to the comparator device.

12. The voltage regulator device according to claim 1, wherein the power device comprises a plurality of power units configured as power switches.

13. A method of operating a voltage regulator device, comprising:
- receiving an input signal and producing a corresponding output signal by a power device;
- receiving the output signal as a feedback signal and producing a compared feedback signal by a comparator device;
- digitally modulating the compared feedback signal by a digital modulation device that comprises a delta-sigma and a quantizer to obtain a digitally modulated signal;
- providing the digitally modulated signal to the power device;

wherein the method further comprises:
- feeding forward the compared feedback signal via a feedforward path beyond the delta-sigma, and
- feeding forward the compared feedback signal to a driver device.

14. The method of claim 13, further comprising feeding back an output signal of the quantizer to the delta-sigma of the digital modulation device by way of a digital modulation feedback path to obtain the digitally modulated signal.

15. The method of claim 13, wherein feeding forward the compared feedback signal via the feedforward path further comprises feeding forward the compared feedback signal to a coupling between the delta-sigma and the quantizer.

16. The method of claim 13, further comprising comparing the feedback signal with a reference voltage by way of the comparator device to produce the compared feedback signal.

17. The method of claim 13, further comprising providing a clock signal to the digital modulation device by way of a clock device.

18. The method of claim 13, wherein the voltage regulator device) is configured as a low dropout, LDO, device.

* * * * *